(12) United States Patent
Park et al.

(10) Patent No.: US 12,061,395 B2
(45) Date of Patent: Aug. 13, 2024

(54) FLAT LIGHTING DEVICE AND DISPLAY DEVICE USING LIGHT-EMITTING DIODE

(71) Applicant: LG ELECTRONICS INC., Seoul (KR)

(72) Inventors: Sungmin Park, Seoul (KR); Wonseok Choi, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/247,782

(22) PCT Filed: Oct. 6, 2020

(86) PCT No.: PCT/KR2020/013564
§ 371 (c)(1),
(2) Date: Apr. 4, 2023

(87) PCT Pub. No.: WO2022/075495
PCT Pub. Date: Apr. 14, 2022

(65) Prior Publication Data
US 2023/0375879 A1 Nov. 23, 2023

(51) Int. Cl.
*G09G 5/00* (2006.01)
*G02F 1/13357* (2006.01)
(Continued)

(52) U.S. Cl.
CPC .. *G02F 1/133611* (2013.01); *G02F 1/133603* (2013.01); *G09G 3/32* (2013.01);
(Continued)

(58) Field of Classification Search
CPC ........ G02F 1/133611; G02F 1/133603; G09G 3/32; G09G 2300/0426; G09G 2300/0842;
(Continued)

(56) References Cited

U.S. PATENT DOCUMENTS 11,282,823 B2* 3/2022 Schwarz ............... H01L 25/167
2007/0279337 A1* 12/2007 Kim ..................... G09G 3/3233
345/76
(Continued)

FOREIGN PATENT DOCUMENTS

KR  1020090046403  5/2009
KR  1020110097121  8/2011
(Continued)

OTHER PUBLICATIONS

PCT International Application No. PCT/KR2020/013564, Written Opinion and International Search Report dated Jul. 5, 2021, 13 pages.

*Primary Examiner* — Jennifer T Nguyen
(74) *Attorney, Agent, or Firm* — LEE, HONG, DEGERMAN KANG & WAIMEY (57) ABSTRACT

The present invention is applicable to a display device-related technical field, and relates to, for example, a flat lighting device and a display device using a light-emitting diode (LED). The present invention relates to a display device including a plurality of individual unit compartment regions, comprising: at least one light-emitting diode provided in the individual unit compartment regions; a gate-on voltage line connected to the light-emitting diode; a first scan line for applying a common voltage to the plurality of individual unit compartment regions; a second scan line for applying a voltage inverted from the common voltage to the plurality of individual unit compartment regions; a data line for applying individual switching voltages to the plurality of individual unit compartment regions; a driving unit including a driving MOSFET device connected to the light-emitting diode; and a switching unit including a switching MOSFET device connected to the first scan line and the data line to perform a switching operation.

17 Claims, 10 Drawing Sheets

(51) Int. Cl.
*G09G 3/32* (2016.01)
*H01L 27/12* (2006.01)
*H01L 25/16* (2023.01)

(52) U.S. Cl.
CPC ... *H01L 27/124* (2013.01); *G09G 2300/0426* (2013.01); *G09G 2300/0842* (2013.01); *G09G 2310/08* (2013.01); *H01L 25/167* (2013.01)

(58) Field of Classification Search
CPC .. G09G 2310/08; H01L 27/124; H01L 25/167
USPC .......................................................... 345/204
See application file for complete search history.

(56) References Cited

U.S. PATENT DOCUMENTS

| | | | | |
|---|---|---|---|---|
| 2013/0076254 A1* | 3/2013 | Tsai | ..................... | H05B 45/38 |
| | | | | 315/192 |
| 2017/0256209 A1* | 9/2017 | Kang | .................... | G09G 3/3413 |
| 2020/0005710 A1* | 1/2020 | Miyata | ................. | G09G 3/3233 |
| 2020/0161520 A1 | 5/2020 | Hugon et al. | | |

FOREIGN PATENT DOCUMENTS

| | | |
|---|---|---|
| KR | 1020130055402 | 5/2013 |
| KR | 1020160008849 | 1/2016 |

* cited by examiner

FLAT LIGHTING DEVICE AND DISPLAY DEVICE USING LIGHT-EMITTING DIODE

CROSS-REFERENCE TO RELATED APPLICATION(S)

This application is the National Stage filing under 35 U.S.C. 371 of International Application No. PCT/KR2020/013564, filed on Oct. 6, 2020, the contents of which is hereby incorporated by reference herein in its entirety.

TECHNICAL FIELD

The present disclosure is applicable to a display device-related technical field, and relates to, for example, a planar lighting device and a display device using a light emitting device (LED).

BACKGROUND

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting device that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting device may be proposed. Such light emitting diode has various advantages, such as long lifespan, low power consumption, excellent initial driving characteristics, high vibration resistance, and the like, compared to a filament-based light-emitting device.

Such an LED has conventionally been mainly used for illumination, but gradually constitutes a display pixel or is used as a backlight. Such LED may be used in a package form.

In a case of conventional LED packages, most of them have a parallel connection structure and are based on a printed circuit board (PCB)-based passive matrix (PM) driving, so that a power efficiency thereof may be low.

To compensate for this, thin film transistor (TFT)-based active matrix (AM) driving has been proposed. To manufacture a circuit for such conventional active matrix (AM) pixel driving using the thin film transistor (TFT), a process of forming the thin film transistor (TFT) and a capacitor on a substrate is required.

In one example, a light emitting device driving scheme based on the above-described active matrix scheme may be applied to a planar lighting device for supplying light to the liquid crystal display, for example, a back light unit (BLU) for high luminance driving and local dimming driving. In this regard, the local dimming may refer to a driving scheme of partially turning off the planar lighting device in a dark screen to improve a contrast ratio of the liquid crystal display.

A method for efficiently achieving such local dimming driving is required.

SUMMARY

Technical Problem

The present disclosure is to provide a display device or a planar lighting device (a back light unit) including multiple individual unit compartment areas driven by an active matrix (AM) scheme.

In addition, the present disclosure is to provide a display device or a planar lighting device (a back light unit) that may significantly increase the number of local dimming zones that may be driven individually.

In addition, the present disclosure is to provide a display device or a planar lighting device (a back light unit) that may improve a manufacturing efficiency because there is no need to manufacture a thin film transistor (TFT).

In addition, the present disclosure is to provide a display device or a planar lighting device (a back light unit) that may prevent a brightness change or a flickering phenomenon of a light emitting device when implementing an AM scheme using a MOSFET.

Technical Solutions

As a first aspect for achieving the above object, a display device including multiple individual unit compartment areas according to the present disclosure includes at least one light emitting device disposed in an individual unit compartment area, a gate-on voltage line connected to the light emitting device, a first scan line for applying a common voltage to the multiple individual unit compartment areas, a second scan line for applying a voltage reversed to the common voltage to the multiple individual unit compartment areas, a data line for applying individual switching voltages to the multiple individual unit compartment areas, a driver including a driving MOSFET connected to the light emitting device, and a switching unit including a switching MOSFET connected to the first scan line and the data line to perform a switching operation.

In addition, the switching unit may include a first switching MOSFET, and a second switching MOSFET connected in parallel with the first switching MOSFET.

In addition, the first switching MOSFET and the second switching MOSFET may be connected in a reverse direction.

In addition, the first switching MOSFET and the second switching MOSFET may be connected to each other such that source terminals thereof face each other.

In addition, a parasitic capacitance between a gate and a drain of the switching MOSFET may be smaller than a parasitic capacitance between a gate and a source of the driving MOSFET.

In addition, the light emitting device may be driven in units of the multiple individual unit compartment areas.

In addition, at least one of the driving MOSFET and the switching MOSFET may be mounted on a wiring layer formed on a substrate.

In addition, a capacitor may be connected between the driver, the switching unit, and the second scan line.

In addition, the capacitor may be formed on a gate-off voltage line connected to the driver.

As a second aspect for achieving the above object, a back light unit for driving a light emitting device in units of multiple individual unit compartment areas includes at least one light emitting device disposed in an individual unit compartment area, a gate-on voltage line connected to the light emitting device, a first scan line for applying a common voltage to the multiple individual unit compartment areas, a second scan line for applying a voltage reversed to the common voltage to the multiple individual unit compartment areas, a data line for applying individual switching voltages to the multiple individual unit compartment areas, a driver including a driving MOSFET connected to the light emitting device, and a switching unit including a switching MOSFET connected to the first scan line and the data line to perform a switching operation, and an optical sheet located on the light emitting device.

In addition, the individual unit compartment area may correspond to a unit of local dimming.

In addition, the at least one light emitting device disposed in the individual unit compartment area may emit light of a single color.

Advantageous Effects

According to an embodiment of the present disclosure, the following effects are obtained.

First, according to the present disclosure, the display device or the planar lighting device (the back light unit) including the multiple individual unit compartment areas driven by the active matrix (AM) scheme may be provided.

To improve the contrast ratio in the display device that requires the backlight, such as the liquid crystal display device, the local dimming function of the back light unit BLU is required, which may be implemented via the AM driving having the configuration described in the present disclosure.

In addition, according to an embodiment of the present disclosure, the feed through voltage generated during the ON/OFF driving of the switching MOSFET may be offset.

Accordingly, the coupling current caused by the parasitic capacitance of the MOSFET in addition to the driving current of the MOSFET may be removed.

Therefore, the flicker may not appear in the driving current of the light emitting unit. Accordingly, the brightness change, the flickering phenomenon, or the like of the display device or the back light unit using such a light emitting unit may be prevented.

Furthermore, according to another embodiment of the present disclosure, additional advantageous and advantageous effects not mentioned herein may be understood by those skilled in the art upon examination of the entirety of the specification and drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions.

In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting device mentioned in this specification is a concept including an LED, a micro LED, and the like.

A circuit for active matrix (AM) pixel driving using such conventional thin film transistor (TFT) includes two thin film transistors (TFTs) and one capacitor C, and thus, is referred to as a 2T-1C circuit.

A process of forming the thin film transistor (TFT) and the capacitor C on a substrate is required to manufacture the circuit for the active matrix (AM) pixel driving using such conventional thin film transistor (TFT).

However, there is a problem in that, because the manufacturing process of such a thin film transistor (TFT) is complicated, manufacturing of the circuit is difficult.

In one example, a light emitting device driving scheme based on the above-described active matrix scheme may be applied to a planar lighting device for supplying light to a liquid crystal display, for example, a back light unit (BLU) for high luminance driving and local dimming driving. In this regard, the local dimming may refer to a driving scheme of partially turning off the planar lighting device in a dark screen to improve a contrast ratio of the liquid crystal display.

However, the conventional thin film transistor (TFT) described above has a problem in that high current/high voltage driving for driving the back light unit (BLU) with the high luminance is difficult. That is, a withstand voltage of several tens of volts (V) and a driving current of several tens of milliamps (mA) are required depending on the number of connected light emitting devices (LEDs), but this may have limitations in implementation with the thin film transistor (TFT).

In addition, a PCB substrate conventionally used to form the thin film transistor (TFT) has a limitation in forming a fine wiring, which may be disadvantageous in expanding the number of local dimming zones and may have a disadvantage of a high cost compared to a glass substrate.

Therefore, in the present document, it is intended to provide a planar lighting device of an active matrix (AM) structure that does not require the thin film transistor (TFT). In one example, the active matrix (AM) structure that does not require the thin film transistor (TFT) according to the present disclosure may be applied to a display device other than the planar lighting device. That is, the active matrix (AM) structure may be applied to various display devices to which the active matrix (AM) driving is applied. Hereinafter, the planar lighting device will be described as the back light unit (BLU) as an example. Therefore, the terms 'planar lighting device' and 'back light unit' may be used interchangeably.

In the present document, an individual pixel driving area may be referred to as an individual unit compartment area. Hereinafter, the display device or the back light unit including multiple individual unit compartment areas driven by the active matrix (AM) scheme will be described.

As mentioned above, a local dimming function of the back light unit (BLU) is required to improve the contrast ratio in the display device that requires a backlight, such as the liquid crystal display device, and this is able to be implemented via the AM driving.

For optimal implementation of the local dimming, the larger the number of local dimming zones that may be driven individually, the better.

Such unit compartment area of the display device according to the present disclosure may constitute an AM circuit of a 3T (transistor) structure using a substrate with a film wiring formed on a surface and three metal oxide semiconductor field effect transistors (MOSFETs).

Because the display device according to the present disclosure does not require the manufacturing of the thin film transistor (TFT), a manufacturing efficiency may be improved and a display panel manufacturing cost may be greatly reduced.

Figure 1:
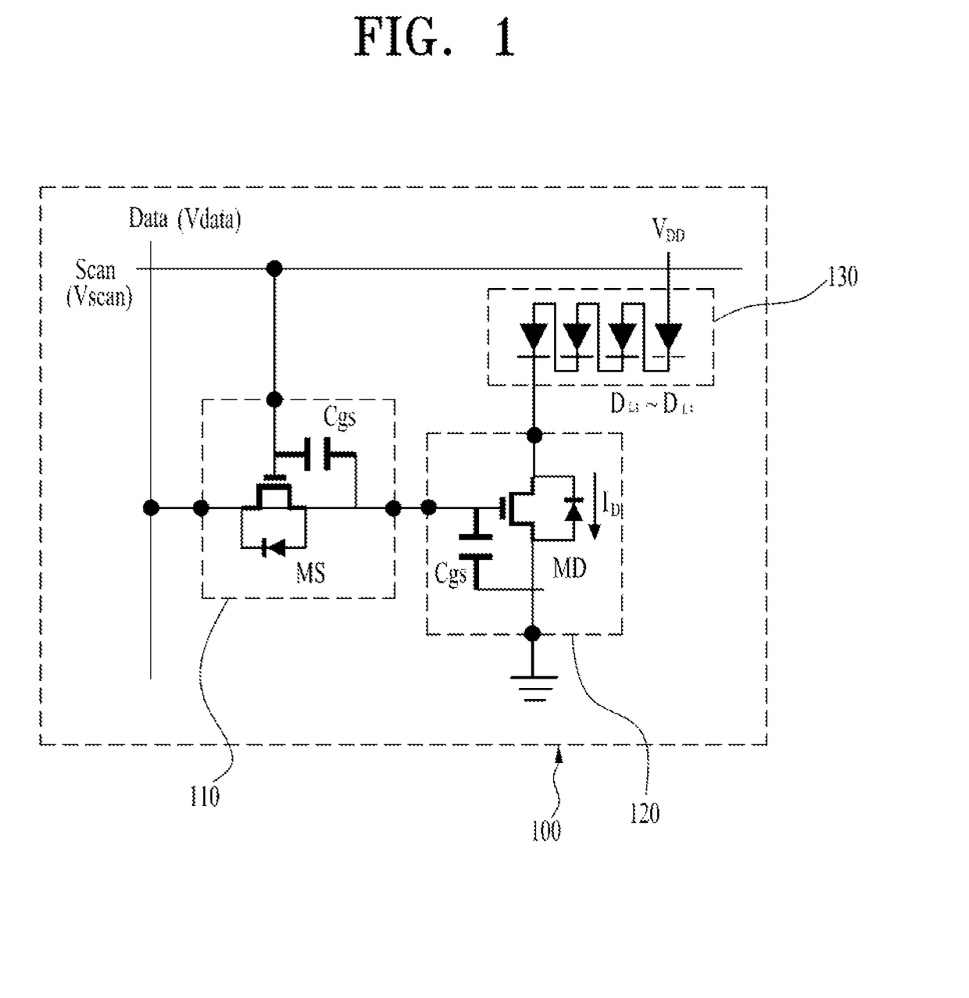
FIG. 1 is a circuit diagram showing a unit compartment area of a display device according to a first embodiment of the present disclosure.

FIG. 1 is a circuit diagram showing a unit compartment area of a display device according to an embodiment of the present disclosure.

Referring to FIG. 1, a unit compartment area 100 may include a switching unit 110 and a driver 120. In this regard, the switching unit 110 and the driver 120 may include the metal oxide semiconductor field effect transistor (MOSFET).

For example, the switching unit 110 may include two MOSFETs MS1 and MS2, and the driver 120 may include one MOSFET MD1.

Figure 6:
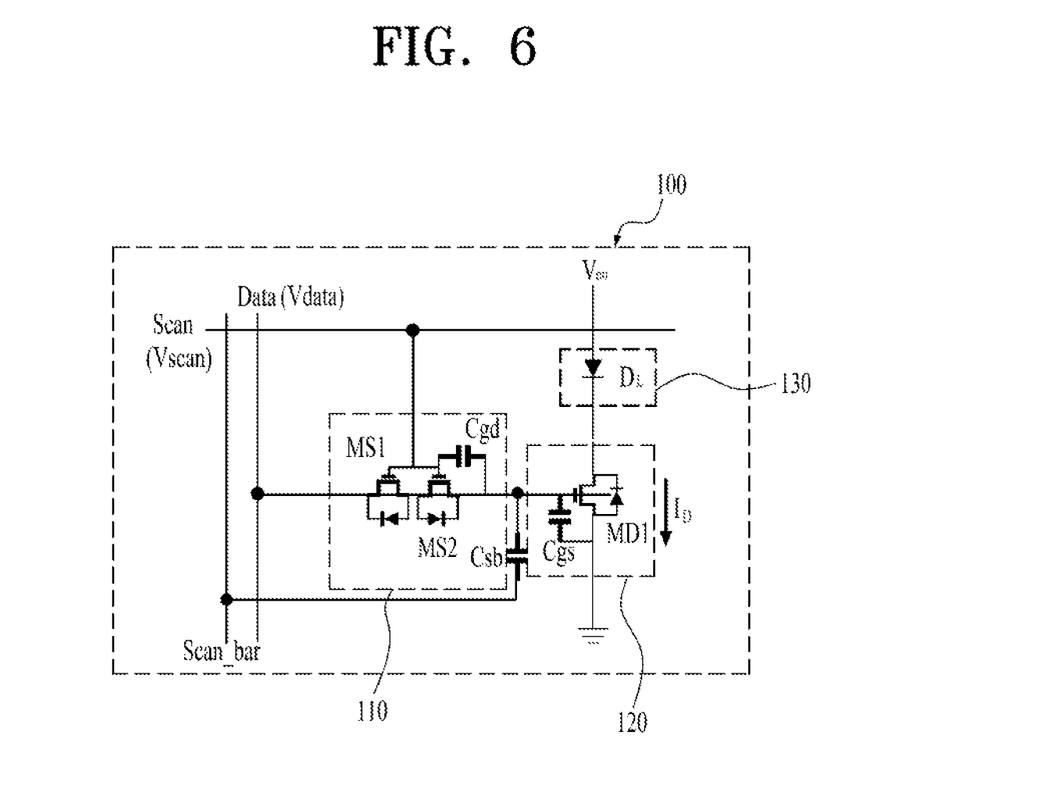
FIG. 6 is a detailed circuit diagram showing a unit compartment area of a display device according to a second embodiment of the present disclosure.

In this regard, the switching MOSFET MS may include the two MOSFETs MS1 and MS2 (see FIG. 6).

That is, the switching unit 110 may include the first switching MOSFET MS1 and the second switching MOSFET MS2 connected in parallel with the first switching MOSFET MS1 with respect to the scan line (Gate; gate line). In this regard, the first switching MOSFET MS1 and a gate terminal of the first switching MOSFET MS1 may be commonly connected to the scan line (Gate; gate line). That is, the switching MOSFET MS in FIG. 1 may mean a MOSFET in which the two MOSFETs MS1 and MS2 are integrated.

The first switching MOSFET MS1 and the second switching MOSFET MS2 may be connected with each other in series with respect to the data line (Data). In this regard, the first switching MOSFET MS1 and the second switching MOSFET MS2 may be connected to each other in a reverse direction.

Specifically, the first switching MOSFET MS1 and the second switching MOSFET MS2 may be connected to each other such that source terminals thereof face each other. That is, a signal of the switching unit 110 may be input/output via drain terminals.

The second switching MOSFET MS2 of the switching unit 110 may be connected to the driving MOSFET MD1 of the driver 120. That is, the drain terminal of the second switching MOSFET MS2 may be connected to a gate terminal of the driving MOSFET MD1.

As such, the unit compartment area 100 includes the drive unit 120 directly connected to the light emitting device DL and the switching unit 110 that is connected to the data line (Data) $V_{DATA}$ and the scan line (Gate) $V_{SCAN}$ to perform the switching operation. In this regard, the scan line (Gate) may also be referred to as the gate line. The $V_{DATA}$ voltage may be applied to the data line (Data), and the VSCAN voltage may be applied to the scan line (Gate). As such, there are the four main wirings VDD, $V_{SS}$, $V_{DATA}$, and $V_{SCAN}$ in the unit compartment area. In FIG. 1 and following drawings, $V_{SS}$ is indicated as the ground.

In some cases, the unit compartment area 100 may correspond to a unit sub-pixel area. That is, when the unit compartment area 100 of the present disclosure is applied to the display device, it may correspond to a unit sub-pixel. In addition, when the unit compartment area 100 of the present disclosure is applied to the back light unit, it may be a unit control area for the local dimming driving. As such, multiple unit compartment areas 100 may be arranged on the display device or the back light unit. In addition, the unit compartment area 100 may also be disposed in other devices for individual driving other than the display device or the back light unit.

As described above, the MOSFETs MS and MD are connected to each unit compartment area 100, so that a light emitting unit 130 including light emitting devices Du to $D_{L4}$ in each unit compartment area 100 may be driven. For example, each light emitting unit 130 may include the four light emitting devices $D_{L1}$ to $D_{L4}$. However, the present disclosure is not limited thereto. That is, one light emitting device may be included or one or more light emitting devices may be included in each unit compartment area.

Referring to FIG. 1, a parasitic capacitance Cgs between a gate and a source included in the driving MOSFET MD included in the driver 120 is shown. A parasitic capacitance Cgs between a gate and a source of the switching MOSFET MS of the switching unit 110 is shown.

In general, the MOSFET has the parasitic capacitance. In addition, the gate of the MOSFET is insulated from the drain and the source by a gate oxide film. In addition, a PN junction is formed between the drain and the source via the substrate, so that a parasitic diode exists. Such parasitic diode is indicated on each MOSFET MS and MD shown in FIG. 1.

Cgs, which is the capacitance between the gate and the source, and Cgd, which is the capacitance between the gate and the drain, may be determined based on a capacitance of the gate oxide film. In addition, Cds, which is the capacitance between the drain and the source, is a junction capacitance of the parasitic diode.

Figure 2:
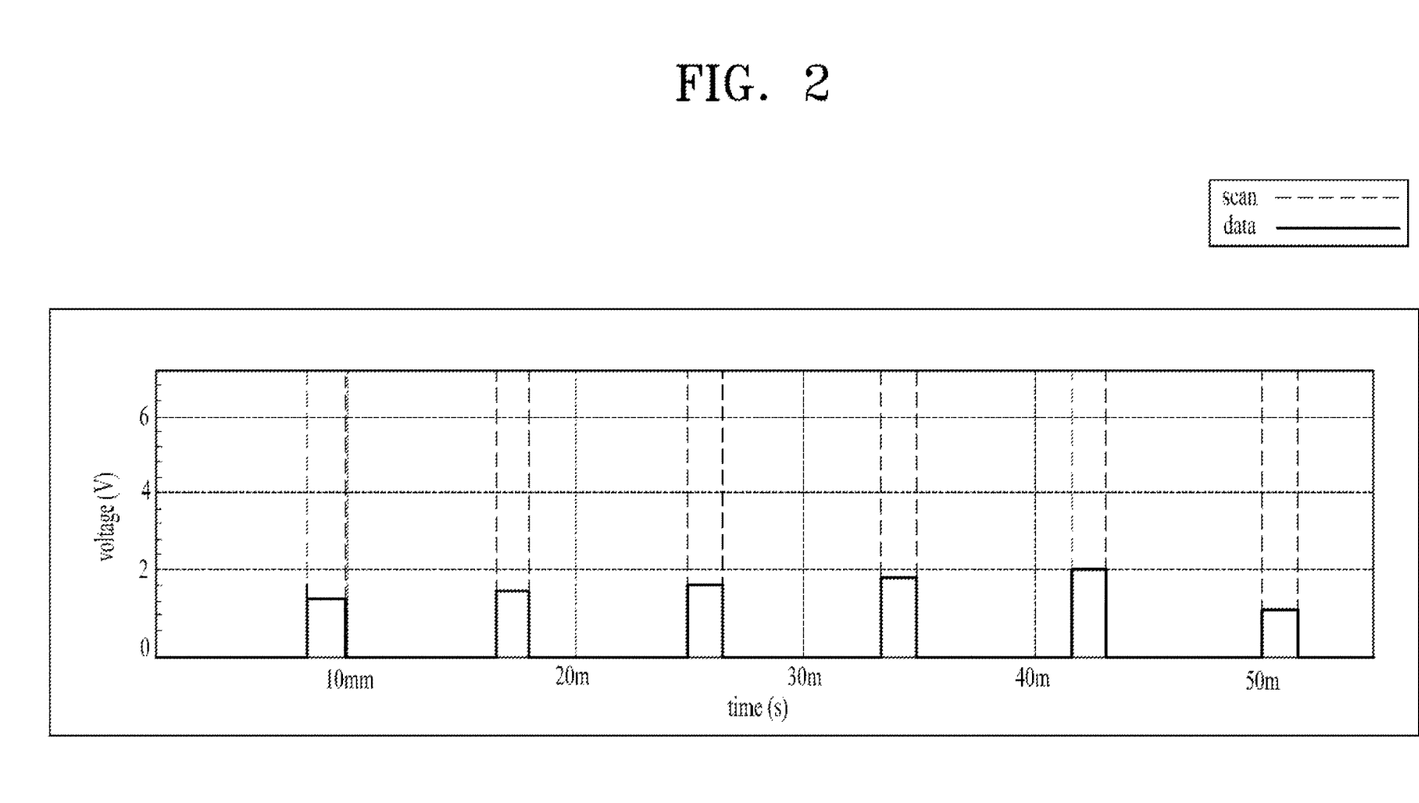
FIG. 2 is a spectrum diagram showing a voltage of a scan line and a voltage of a data line by a circuit in FIG. 1.

FIG. 2 is a spectrum diagram showing a voltage of a scan line (Scan) and a voltage of a data line (Data) by a circuit in FIG. 1. In addition, FIG. 3 is a spectrum diagram showing a driving current of a light emitting device by a circuit in FIG. 1.

Referring to FIG. 2, in the AM circuit structure for the active matrix (AM) driving, because a voltage difference of a scan voltage of the gate terminal of the switching MOSFET MS between a turn on state and a turn off state is quite great, a great voltage difference may be instantaneously applied to the light emitting unit 130. As such, a voltage applied to a capacitor or a parasitic capacitor during switching is referred to as a feed through voltage.

Figure 3:
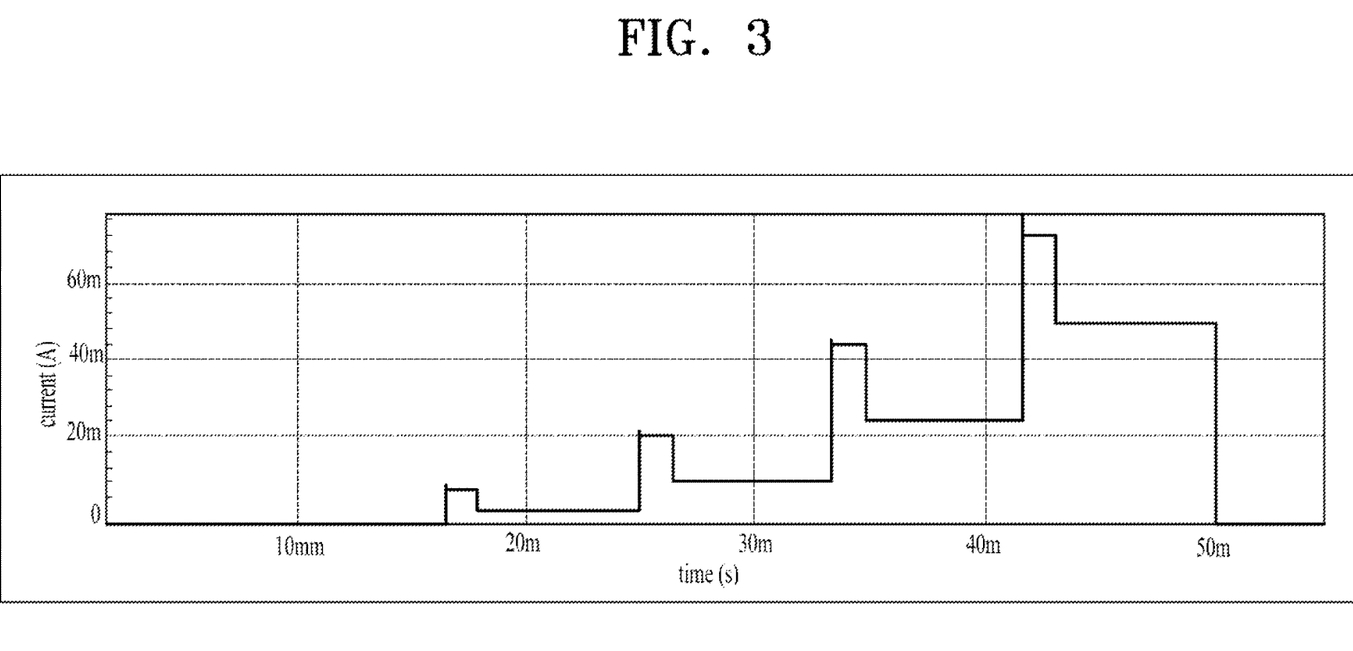
FIG. 3 is a spectrum diagram showing a driving current of a light emitting device by a circuit in FIG. 1.

Accordingly, as shown in FIG. 3, a change in the driving current of the light emitting unit 130 may appear because of a coupling current caused by the parasitic capacitance of the MOSFET in addition to the driving current of the MOSFET.

Referring to FIG. 3, it may be seen that a flicker F appears in the driving current of the light emitting unit 130. Accordingly, a brightness change or a flickering phenomenon of the display device or the back light unit using the light emitting unit 130 may occur.

Figure 4:
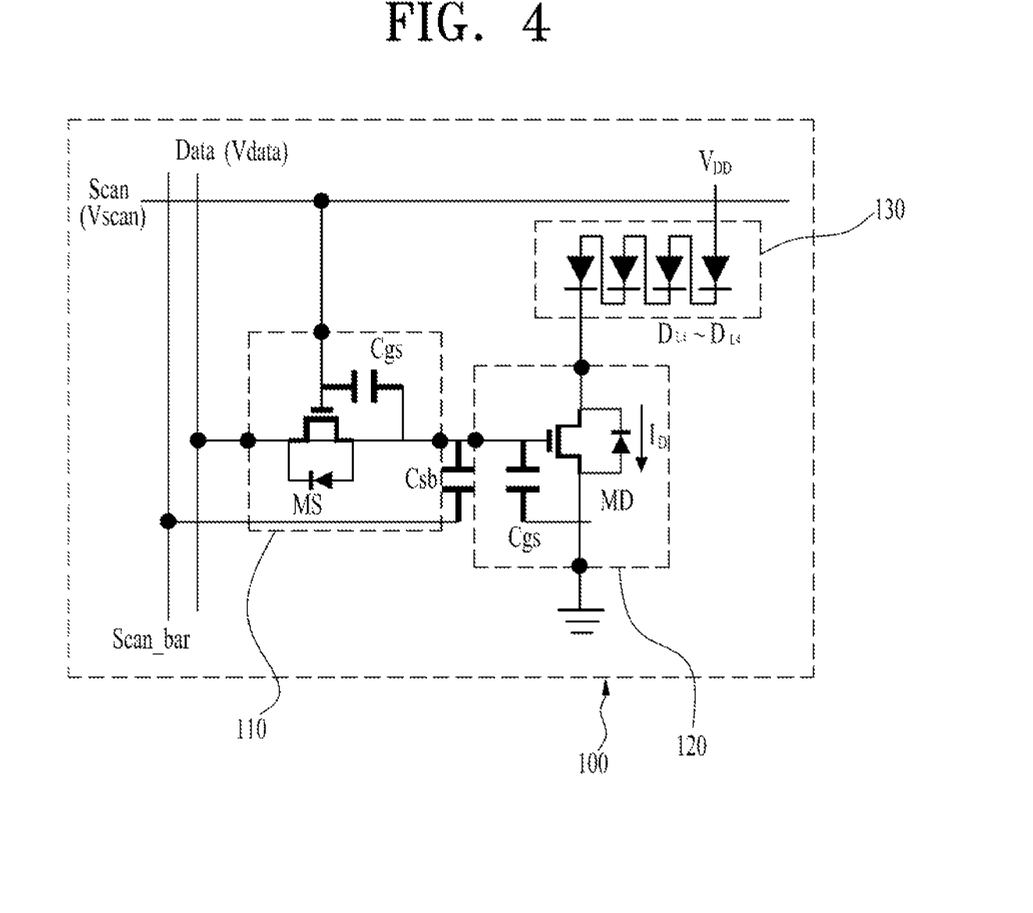
FIG. 4 is a circuit diagram showing a unit compartment area of a display device according to a second embodiment of the present disclosure.
Figure 5:
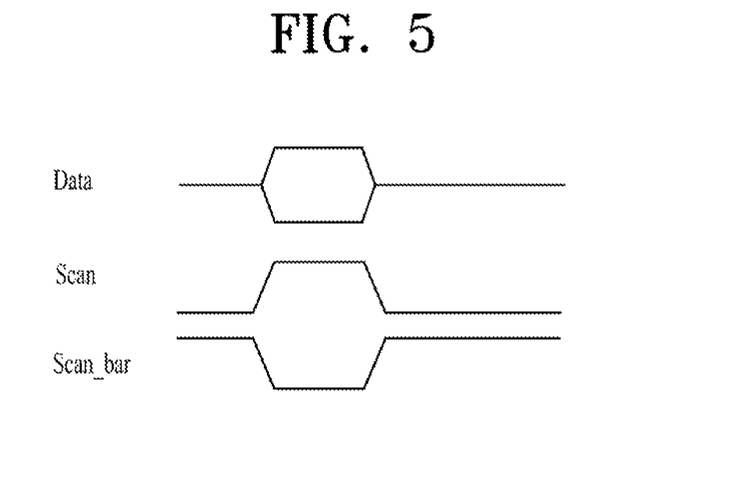
FIG. 5 is a signal diagram showing a voltage application state in a circuit in FIG. 4.

FIG. 4 is a circuit diagram showing a unit compartment area of a display device according to a second embodiment of the present disclosure. FIG. 5 is a signal diagram showing a voltage application state in a circuit in FIG. 4.

Referring to FIG. 1, a unit compartment area 100 may include a switching unit 110 and a driver 120. In this regard, the switching unit 110 and the driver 120 may include the metal oxide semiconductor field effect transistor (MOSFET).

For example, the switching unit 110 may include a switching MOSFET MS, and the driver 120 may include a driving MOSFET MD.

In this regard, the switching MOSFET MS may include the two MOSFETs MS1 and MS2 (see FIG. 6).

That is, the switching unit 110 may include the first switching MOSFET MS1 and the second switching MOSFET MS2 connected in parallel with the first switching MOSFET MS1 with respect to the scan line (Gate; gate line). In this regard, the first switching MOSFET MS1 and a gate terminal of the first switching MOSFET MS1 may be commonly connected to the scan line (Gate; gate line). That is, the switching MOSFET MS in FIG. 4 may mean a MOSFET in which the two MOSFETs MS1 and MS2 are integrated.

In this case, the first switching MOSFET MS1 and the second switching MOSFET MS2 may be connected with each other in series with respect to the data line (Data). In this regard, the first switching MOSFET MS1 and the second switching MOSFET MS2 may be connected to each other in a reverse direction.

Specifically, the first switching MOSFET MS1 and the second switching MOSFET MS2 may be connected to each other such that source terminals thereof face each other. That is, a signal of the switching unit 110 may be input/output via drain terminals.

The second switching MOSFET MS of the switching unit 110 may be connected to the driving MOSFET MD of the driver 120. That is, the drain terminal of the second switching MOSFET MS may be connected to a gate terminal of the driving MOSFET MD.

As such, the unit compartment area 100 includes the drive unit 120 directly connected to the light emitting devices $D_{L1}$ to $D_{L4}$ and the switching unit 110 that is connected to the data line (Data) $V_{DATA}$ and the scan line (Gate) $V_{SCAN}$ to perform the switching operation. In this regard, the scan line (Gate) may also be referred to as the gate line. The $V_{DATA}$ voltage may be applied to the data line (Data), and the $V_{SCAN}$ voltage may be applied to the scan line (Gate). As such, there are the four main wirings $V_{DD}$, $V_{SS}$, $V_{DATA}$, and $V_{SCAN}$ in the unit compartment area. In FIG. 4 and following drawings, $V_{SS}$ is indicated as the ground.

In some cases, the unit compartment area 100 may correspond to a unit sub-pixel area. That is, when the unit compartment area 100 of the present disclosure is applied to the display device, it may correspond to a unit sub-pixel. In addition, when the unit compartment area 100 of the present disclosure is applied to the back light unit, it may be a unit control area for the local dimming driving. As such, multiple unit compartment areas 100 may be arranged on the display device or the back light unit. In addition, the unit compartment area 100 may also be disposed in other devices for individual driving other than the display device or the back light unit.

As described above, the MOSFETs MS and MD are connected to each unit compartment area 100, so that the light emitting unit 130 including the light emitting devices $D_{L1}$ to $D_{L4}$ in each unit compartment area 100 may be driven. For example, each light emitting unit 130 may include the four light emitting devices $D_{L1}$ to $D_{L4}$.

A unit light emitting area may be defined by the MOSFETs MS1, MS2, and MD1 connected to the data line $V_{DATA}$ and the scan line $V_{SCAN}$.

As mentioned above, there are the four main wirings $V_{DD}$, $V_{SS}$, $V_{DATA}$, and $V_{SCAN}$ in the single pixel. Such four wirings $V_{DD}$, $V_{SS}$, $V_{DATA}$, and $V_{SCAN}$ may include the scan line $V_{SCAN}$ connected to gate terminals of the switching MOSFETs MS1 and MS2, the data line $V_{DATA}$ connected to drain (or source) terminals of the switching MOSFETs MS1 and MS2, and the gate-on voltage line $V_{DD}$ connected to the anode of the light emitting device $D_{L1}$ to $D_{L4}$.

In this regard, the gate-on voltage $V_{DD}$ corresponds to the highest voltage applied to drive the light emitting devices $D_{L1}$ to $D_{L4}$.

When the driving voltage $V_{DATA}$ and the common voltage $V_{SCAN}$ are applied, the switching operation in which the ON/OFF of the signal transmission is determined occurs in the switching unit 110.

By such a switching operation, the driver 120 determines the voltage substantially applied to the light emitting devices $D_{L1}$ to $D_{L4}$ based on the driving voltage $V_{DATA}$ and the current accordingly flowing through the light emitting devices $D_{L1}$ to $D_{L4}$.

That is, in the switching unit 110 including the first switching MOSFET MS1 and the second switching MOSFET MS2, the operation may occur in the switching area, and in the driver 120 including the driving MOSFET MD1, the operation may occur in the linear area before the saturation.

In this regard, the separate capacitor may not be disposed in the driving MOSFET MD1. That is, no capacitor is connected between the gate terminal and the drain (or source) terminal of the driving MOSFET MD1. In other words, a parasitic capacitance Cgs of the driving MOSFET MD1 may be used. This will be described in detail below.

Referring to FIG. 4, a parasitic capacitance Cgs between a gate and a source included in the driving MOSFET MD included in the driver 120 is shown. A parasitic capacitance Cgs between a gate and a source of the switching MOSFET MS of the switching unit 110 is shown.

Referring to FIG. 6, the MOSFET MS may mean a MOSFET in which the two MOSFETs MS1 and MS2 are integrated. In addition, the first switching MOSFET MS1 and the second switching MOSFET MS2 may be connected to each other such that source terminals thereof face each other. That is, a signal of the switching unit 110 may be input/output via a drain terminal. Accordingly, while the parasitic capacitance Cgs between the gate and the source is shown in FIG. 4, the parasitic capacitance Cgd between the gate and the drain is shown in FIG. 6. However, this may be merely a difference in notation. That is, the switching units 110 shown in FIGS. 1 and 4 may be equivalent to the switching unit 110 shown in FIG. 6.

In general, the MOSFET has the parasitic capacitance. In addition, the gate of the MOSFET is insulated from the drain and the source by a gate oxide film. In addition, a PN junction is formed between the drain and the source via the substrate, so that a parasitic diode exists. Such parasitic diode is indicated on each MOSFET MS and MD shown in FIG. 4.

Cgs, which is the capacitance between the gate and the source, and Cgd, which is the capacitance between the gate and the drain, may be determined based on a capacitance of the gate oxide film. In addition, Cds, which is the capacitance between the drain and the source, is a junction capacitance of the parasitic diode.

Such capacitance may be provided in a data sheet of the MOSFET. For example, Ciss, Coss, and the like may be provided.

Ciss is an input capacitance. It is a sum of the capacitance Cgs between the gate and the source and the capacitance Cgd between the gate and the drain, and is a capacitance of the entire MOSFET viewed from an input side. To operate the MOSFET, it is necessary to charge such capacitance. An amount of charge required to charge the Ciss is Qg.

Coss is an output capacitance. It is a sum of the capacitance Cds between the drain and the source and the capacitance Cgs between the gate and the drain, and is a total capacitance on an output side. When the Coss is great, even when the gate is turned off, a current caused by Coss flows on the output side, so that it may take some time until the output side is completely turned off. In other words, because an accumulated charge remains even after the MOSFET is turned off, the light emitting device $D_L$ may be driven for at least one frame without the separate capacitor.

Therefore, a separate capacitor for charge accumulation may not be disposed between the gate and the source of the driving MOSFET MD included in the driver 120.

As described above, in driving such a circuit, the change in the driving current of the light emitting unit 130 may appear because of the coupling current caused by the parasitic capacitance of the MOSFET in addition to the driving current of the MOSFET.

Therefore, the flicker (F) may appear in the driving current of the light emitting unit 130, and accordingly, the brightness change or the flickering phenomenon of the display device or the back light unit using the light emitting unit 130 may occur.

In the present embodiment, in order to solve such problem, in addition to the scan line (Scan) and the data line (Data) for the AM driving, a separate scan line Scan_bar to which a voltage having a phase difference of 180 degrees from the scan voltage Vscan applied to the scan line is applied may be connected to the driver 120.

That is, referring to FIG. 4, the scan line may include a first scan line (Scan) for applying the common voltage Vscan to the multiple individual unit compartment areas 100 and a second scan line Scan_bar for applying a voltage (see FIG. 5) inverted to the common voltage Vscan to the multiple individual unit compartment areas 100.

Referring to FIG. 5, it may be seen that, when the light emitting unit 130 is turned on, the voltage is applied to the data line (Data) and the first scan line (Scan), and the voltage inverted to that of the first scan line (Scan) is applied to the second scan line Scan_bar.

In one example, such second scan line Scan_bar may be connected to the driver 120 via a capacitor Csb. As one embodiment, the second scan line Scan_bar may be connected between the driver 120 and the switching unit 110 via the capacitor Csb.

In this regard, it is advantageous that a difference between a capacitance of the separate capacitor Csb and a capacitance of Cgs, which is a parasitic capacitance inside the switching MOSFET MS of the switching unit 110, is equal to or smaller than 10%.

A separate capacitor may be used as such capacitor Csb, and the capacitor Csb may be formed on a metal pad constituting a gate-off voltage line connected to the driver 120. This will be described later.

A voltage having an opposite phase to the scan voltage Vscan may be applied to the second scan line Scan_bar. Therefore, the feed through voltage generated during on/off driving of the switching MOSFET MS/MS1 and MS2 of the switching unit 110 may be offset. In addition, as a result, the coupling current is reduced, so that the brightness change of the light emitting unit 130 may be reduced.

The flicker (F) appearing in the driving current of the light emitting unit 130 may be removed, and accordingly, the brightness change or the flickering phenomenon of the display device or the back light unit using the light emitting unit 130 may be reduced.

As described above, when the MOSFETs MS1, MS2, and MD are used for the switching unit 110 and the driver 120, because there is no need to manufacture the thin film transistor (TFT), a manufacturing efficiency of the display device and the back light unit may be improved. In addition, a cost of manufacturing a panel for this purpose may be greatly reduced.

Although a process of forming a thin film of a multi-layer structure is required for the manufacture of the thin film transistor (TFT), a basic wiring process is mainly required for the manufacture of the switching unit 110 and the driver 120 using the MOSFETs MS1, MS2, and MD described above.

In addition, because the MOSFET is applied, the driving voltage of the light emitting device (LED) may be relatively high and a current acceptable limit may be high.

Usually, a driving current/voltage of several tens of mA and several tens of V is required to drive the high-luminance back light unit BLU. Because the MOSFET has an acceptable limit of hundreds of mA and hundreds of V, the MOSFET may be easily applied to such a high-luminance back light unit.

In this regard, the parasitic capacitance Cgs of the driving MOSFET MD1 may be appropriately about 1 to 50 pF.

On the other hand, referring to FIG. 6, it may be advantageous to minimize the parasitic capacitance of the switching unit 110.

For example, the capacitance Cgd between the gate and the drain of the second switching MOSFET MS2 connected to the driver 120 may be appropriately about 1 to 10 pF.

In this regard, it is preferable that the capacitance Cgd between the gate and the drain of the second switching MOSFET MS2 is smaller than the capacitance Cgs between the gate and the source of the driving MOSFET MD1. This is because, when the capacitance Cgd between the gate and the drain of the second switching MOSFET MS2 is greater than the capacitance Cgs between the gate and the source of the driving MOSFET MD1, the voltage may not be maintained and a voltage drop may occur when the signal is turned off.

Figure 7:
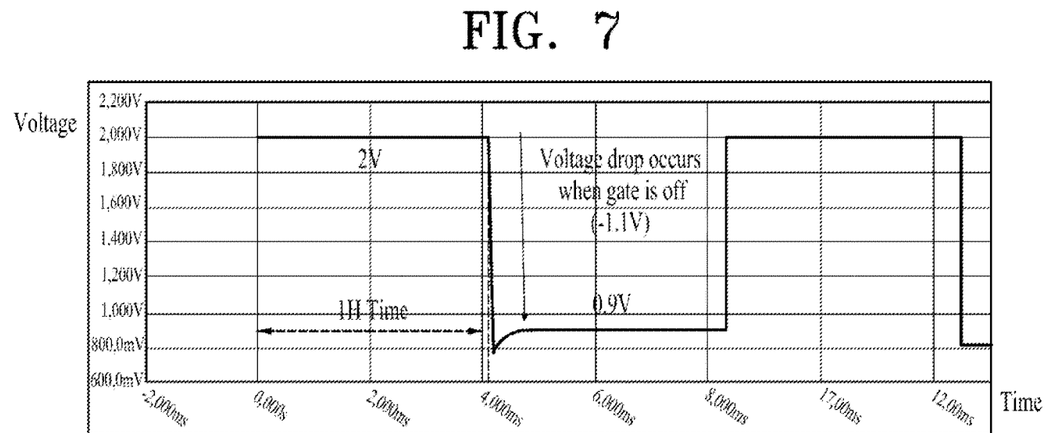
FIG. 7 is a spectrum diagram showing an example of a voltage pattern of a driver of a display device according to an embodiment of the present disclosure.
Figure 8:
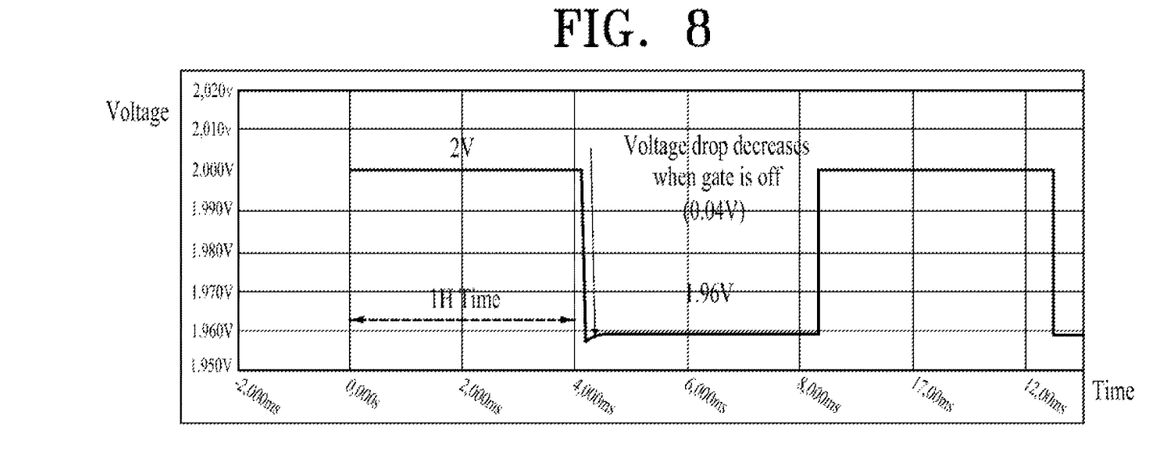
FIG. 8 is a spectrum diagram showing another example of a voltage pattern of a driver of a display device according to an embodiment of the present disclosure.

FIG. 7 is a spectrum diagram showing an example of a voltage pattern of a driver of a display device according to an embodiment of the present disclosure, and FIG. 8 is a spectrum diagram showing another example of a voltage pattern of a driver of a display device according to an embodiment of the present disclosure.

First, FIG. 7 shows a voltage pattern of the driver 120 when a capacitance of the switching unit 110 is greater than a capacitance of the driver 120.

Specifically, FIG. 7 shows a voltage pattern (an output voltage) of the driving MOSFET MD1 when the capacitance Cgd between the gate and the drain of the second switching MOSFET MS2 is greater than the capacitance Cgs between the gate and the source of the driving MOSFET MD1.

As shown, for example, when an initial gate voltage is 2 V, a gate voltage may be turned off (Gate off) after one frame 1H has passed. In this regard, in the situation shown in FIG. 7, for example, a great voltage drop (−1.1 V) may occur. Therefore, the gate voltage may be reduced to 0.9 V.

On the other hand, FIG. 8 shows a voltage pattern (an output voltage) when the capacitance Cgd between the gate and the drain of the second switching MOSFET MS2 is smaller than the capacitance Cgs between the gate and the source of the driving MOSFET MD1.

As shown, for example, when the initial gate voltage is 2 V, the gate voltage may be turned off (Gate off) after one write time (1H) has passed. In this regard, in the situation shown in FIG. 6, for example, a small voltage drop (−0.04 V) may occur. Therefore, the gate voltage may be reduced to 1.96 V and substantially the same current may flow through the driving MOSFET MD1.

This may be negligible or compensable when driving the display device or the back light unit.

Figure 9:
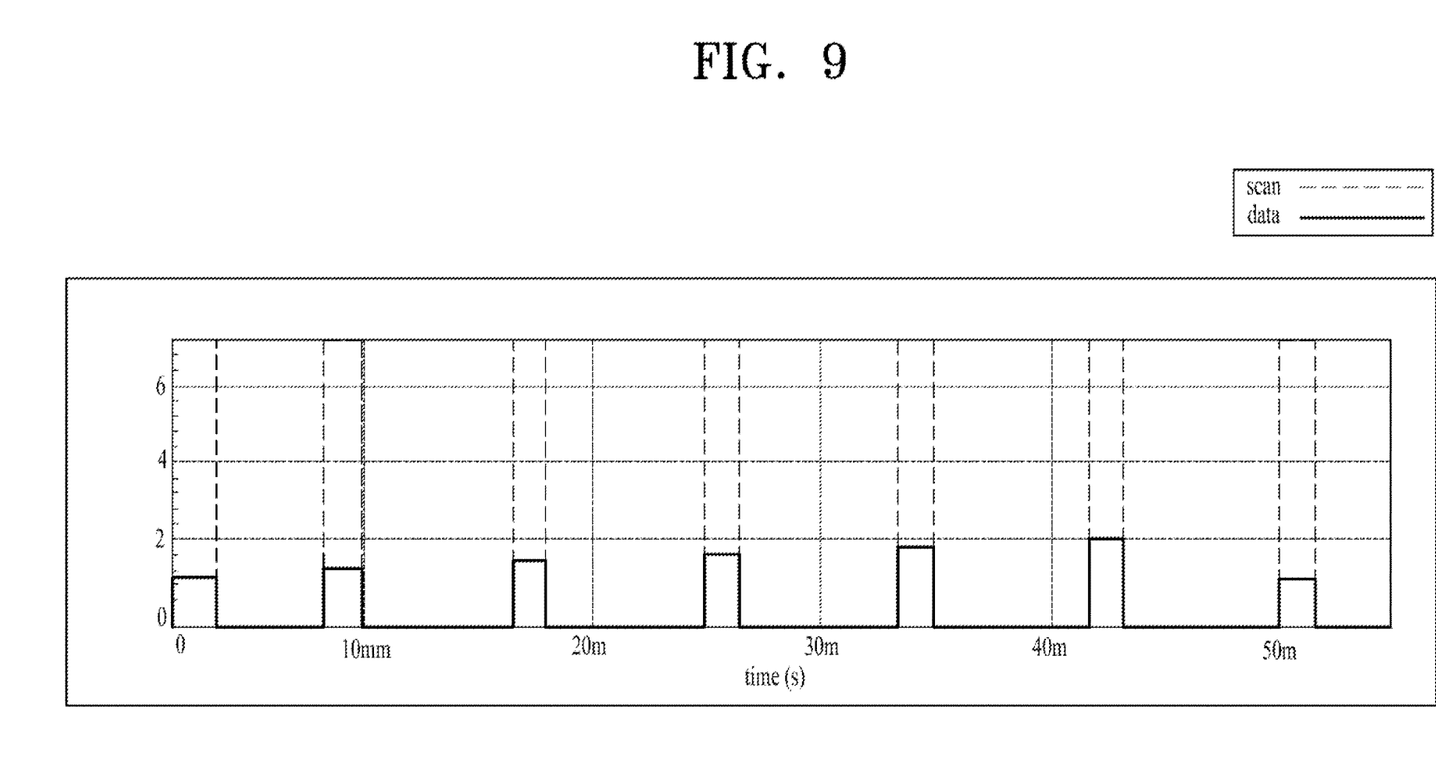
FIG. 9 is a spectrum diagram showing a voltage of a scan line and a voltage of a data line by a circuit in FIG. 4 (or FIG. 6).

FIG. 9 is a spectrum diagram showing a voltage of a scan line (Scan) and a voltage of a data line (Data) by a circuit in FIG. 4 (or FIG. 6). In addition, FIG. 10 is a spectrum diagram showing a driving current of a light emitting device by a circuit in FIG. 4 (or FIG. 6).

Referring to FIG. 9, in the AM circuit structure for the active matrix (AM) driving, because the voltage difference of the scan voltage of the gate terminal of the switching MOSFET MS between the turn on state and the turn off state is quite great, the great voltage difference may be instantaneously applied to the light emitting unit 130.

In this regard, because the voltage having the opposite phase to the voltage of the first can line (Scan) is applied to the second scan line Scan_bar, the feed through voltage generated during the on/off driving of the switching MOSFET MS/MS1 and MS2 may be offset.

Figure 10:
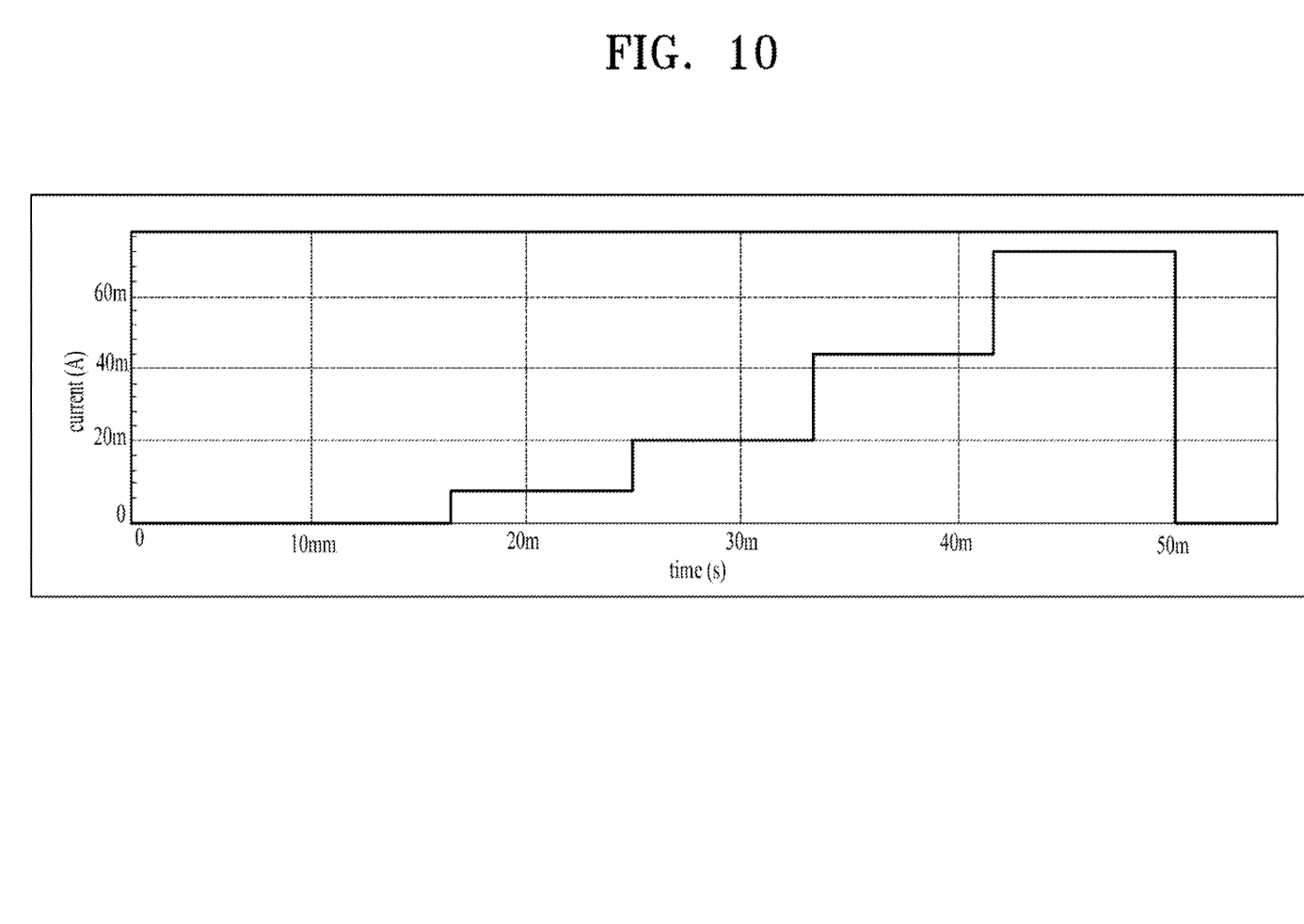
FIG. 10 is a spectrum diagram showing a driving current of a light emitting device by a circuit in FIG. 4 (or FIG. 6).

Accordingly, as shown in FIG. 10, the coupling current caused by the parasitic capacitance of the MOSFET in addition to the driving current of the MOSFET may be removed.

Therefore, referring to FIG. 10, it may be seen that the flicker (F) does not appear in the driving current of the light emitting unit 130. Accordingly, the brightness change or the flickering phenomenon of the display device or the back light unit using the light emitting unit 130 may be prevented.

In this regard, as described above, the second scan line Scan_bar may be connected between the switching unit 110 and the driver 120 by the separate capacitor Csb. With such capacitor Csb, the flicker may be alleviated more smoothly.

In addition, it is advantageous that the difference between the capacitance of the separate capacitor Csb and the capacitance of Cgs, which is the parasitic capacitance inside the switching MOSFET MS of the switching unit 110, is equal to or smaller than 10%.

Figure 11:
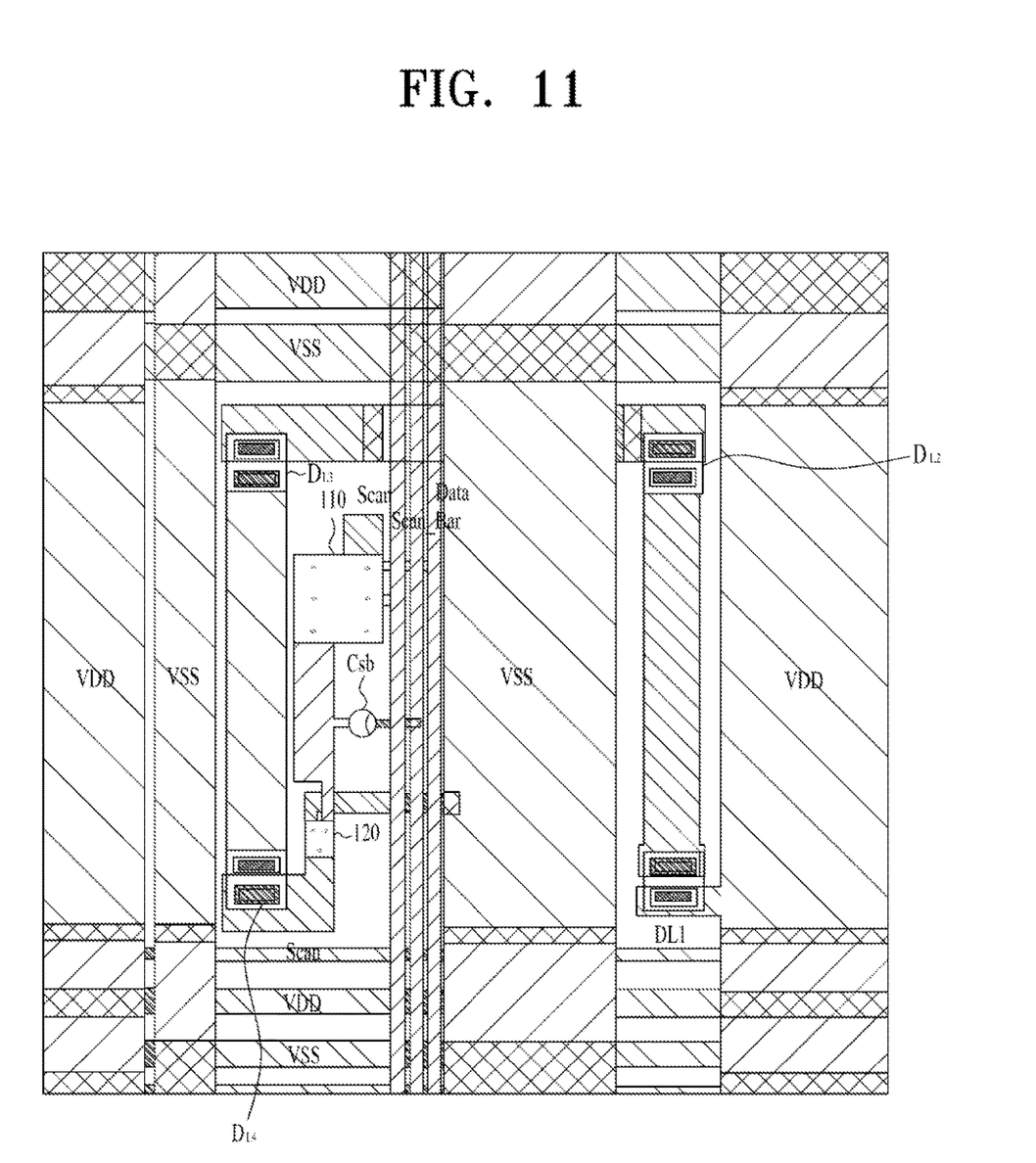
FIG. 11 is a plan view showing an example of a unit compartment area of a display device according to a second embodiment of the present disclosure.

FIG. 11 is a plan view showing an example of a unit compartment area of a display device according to a second embodiment of the present disclosure.

Referring to FIG. 11, an example of a structure in which the circuit diagram of the unit compartment area shown in FIG. 4 (FIG. 6) is implemented on a substrate is shown.

As shown, in the switching unit 110, the MOSFET in which the two MOSFETs are integrated may be connected to each of the first scan line (Scan) and the data line (Data), and, in the driver 120, one MOSFET may be connected to the switching unit 110 and the light emitting devices $D_{L1}$ to $D_{L4}$ of the light emitting unit 130.

In this regard, the four light emitting devices $D_{L1}$ to $D_{L4}$ included in the light emitting unit 130 may be arranged at an equal spacing.

That is, one light emitting device $D_L$ may be disposed in the individual unit compartment area 100, but as shown in FIG. 11, multiple light emitting devices $D_{L1}$, $D_{L2}$, $D_{L3}$, and $D_{L4}$ may be disposed.

As such, the multiple light emitting devices $D_L$ may be disposed in the individual unit compartment area 100. With such configuration, the multiple light emitting devices $D_{L1}$ to $D_{L4}$ included in the individual unit compartment area 100 may simultaneously emit light.

As shown in FIG. 11, when the multiple light emitting devices $D_{L1}$ to $D_{L4}$ are disposed in the individual unit compartment area 100 and are used for the back light unit, the multiple light emitting devices $D_{L1}$ to $D_{L4}$ may emit light of the same color. For example, the multiple light emitting devices $D_{L1}$ to $D_{L4}$ may emit white light. At least one of a light emitting device that is converted in color by a phosphor and a light emitting device that the emits white light by a combination of red, green, and blue light emitting units may be used as the light emitting devices $D_{L1}$ to $D_{L4}$ emitting the white light.

In this regard, the individual unit compartment area 100 may correspond to a unit of the local dimming of the back light unit. As such, because ON/OFF and brightness adjustment of the light emitting devices $D_{L1}$ to $D_{L4}$ are possible for each individual unit compartment area, for example, when the back light unit is used in the liquid crystal display device, the contrast ratio may be improved.

In one example, the second scan line Scan_bar may be connected between the switching MOSFET and the driving MOSFET via the capacitor Csb. That is, the capacitor Csb may be connected between the gate terminal of the driving MOSFET and the second scan line Scan_bar.

In addition, the gate-off voltage line $V_{SS}$ connected to the driving MOSFET and the gate-on voltage line $V_{DD}$ connected to anodes of the light emitting devices $D_{L1}$ to $D_{L4}$ are marked.

Figure 12:
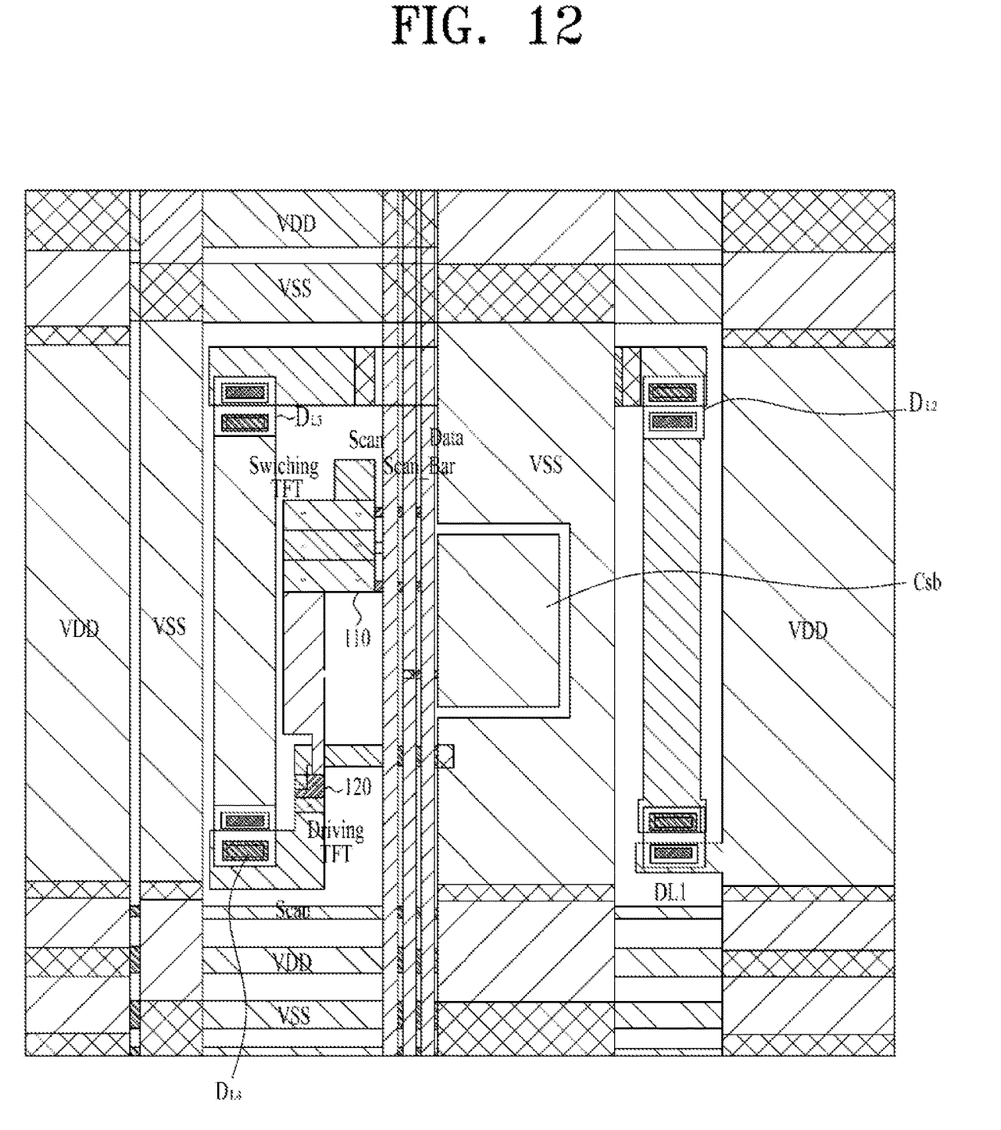
FIG. 12 is a plan view showing another example of a unit compartment area of a display device according to a second embodiment of the present disclosure.

FIG. 12 is a plan view showing another example of a unit compartment area of a display device according to a second embodiment of the present disclosure.

Referring to FIG. 12, an example of a structure in which the circuit diagram of the unit compartment area shown in FIG. 4 (FIG. 6) is implemented on a substrate is shown.

As shown, in the switching unit 110, the MOSFET in which the two MOSFETs are integrated may be connected to each of the first scan line (Scan) and the data line (Data), and, in the driver 120, one MOSFET may be connected to the switching unit 110 and the light emitting devices $D_{L1}$ to $D_{L4}$ of the light emitting unit 130.

Hereinafter, differences from FIG. 11 will be mainly described. Description of the rest may be the same as those described with reference to FIG. 12.

Referring to FIG. 12, the gate-off voltage line $V_{SS}$ connected to the driving MOSFET and the gate-on voltage line $V_{DD}$ connected to the anodes of the light emitting devices $D_{L1}$ to $D_{L4}$ are marked.

The second scan line Scan_bar may be connected between the switching MOSFET and the driving MOSFET via the capacitor Csb. That is, the capacitor Csb may be connected between the gate terminal of the driving MOSFET and the second scan line Scan_bar.

In this regard, the capacitor Csb may be formed using a portion of the gate-off voltage line $V_{SS}$. That is, because the capacitor Csb may be constructed using two parallel electrodes, the capacitor Csb may be constructed using a partial area of the gate-off voltage line $V_{SS}$. In this regard, another metal plate parallel to the partial area of such gate-off voltage line $V_{SS}$ exists, but is omitted here. In addition, an insulating layer may be included as a dielectric between these two areas.

As such, as the capacitor Csb is formed using the portion of the gate-off voltage line $V_{SS}$, a material cost may be lowered and a space of the display device or the back light unit may be efficiently used.

On the other hand, the display device or the back light unit may be implemented using the conventional thin film transistor (TFT) without using the MOSFET as described above. That is, the separate capacitor Csb may be connected to the second scan line Scan_bar between a switching TFT and a driving TFT. A detailed description thereof will be omitted.

As described above, according to the present disclosure, the display device or the planar lighting device (the back light unit) including the multiple individual unit compartment areas driven by the active matrix (AM) scheme may be provided.

As mentioned above, to improve the contrast ratio in the display device that requires the backlight, such as the liquid crystal display device, the local dimming function of the back light unit BLU is required, which may be implemented via the AM driving having the configuration described in the present disclosure.

In addition, according to an embodiment of the present disclosure, the feed through voltage generated during the ON/OFF driving of the switching MOSFET MS/MS1 and MS2 may be offset.

Accordingly, the coupling current caused by the parasitic capacitance of the MOSFET in addition to the driving current of the MOSFET may be removed.

Therefore, the flicker F may not appear in the driving current of the light emitting unit 130. Accordingly, the brightness change, the flickering phenomenon, or the like of the display device or the back light unit using such a light emitting unit 130 may be prevented.

In this regard, as described above, the second scan line Scan_bar may be connected between the switching unit 110 and the driver 120 by the separate capacitor Csb. With such capacitor Csb, the flicker may be alleviated more smoothly.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, the display device using a light emitting device (LED), the planar lighting device, and the liquid crystal display device using the same may be provided.

What is claimed is:

1. A display device including multiple individual unit compartment areas, the display device comprising:
at least one light emitting device disposed in an individual unit compartment area;
a gate-on voltage line connected to the at least one light emitting device;
a first scan line for applying a common voltage to the multiple individual unit compartment areas;
a second scan line for applying a voltage reversed to the common voltage to the multiple individual unit compartment areas;
a data line for applying individual switching voltages to the multiple individual unit compartment areas;
a driver including a driving MOSFET (Metal Oxide Semiconductor Field Effect Transistor) connected to the at least one light emitting device; and
a switching unit including a switching MOSFET connected to the first scan line and the data line to perform a switching operation,
wherein the switching unit includes:
a first switching MOSFET; and
a second switching MOSFET connected in parallel with the first switching MOSFET with respect to the first scan line, wherein the first switching MOSFET and the second switching MOSFET are connected in a reverse direction.

2. The display device of claim 1, wherein the first switching MOSFET and the second switching MOSFET are connected such that source terminals thereof face each other.

3. The display device of claim 1, wherein a parasitic capacitance between a gate and a drain of the switching MOSFET is smaller than a parasitic capacitance between a gate and a source of the driving MOSFET.

4. The display device of claim 1, wherein the at least one light emitting device is driven in units of the multiple individual unit compartment areas.

5. The display device of claim 1, wherein at least one of the driving MOSFET or the switching MOSFET is mounted on a wiring layer formed on a substrate.

6. The display device of claim 1, wherein the second scan line is connected between the driver and the switching unit via a capacitor.

7. The display device of claim 6, wherein the capacitor is formed on a gate-off voltage line connected to the driver.

8. A planar lighting device using a light emitting device for driving the light emitting device in units of multiple individual unit compartment areas, the planar lighting device comprising:
   at least one light emitting device disposed in an individual unit compartment area;
   a gate-on voltage line connected to the light emitting device;
   a first scan line for applying a common voltage to the multiple individual unit compartment areas;
   a second scan line for applying a voltage reversed to the common voltage to the multiple individual unit compartment areas;
   a data line for applying individual switching voltages to the multiple individual unit compartment areas;
   a driver including a driving MOSFET (Metal Oxide Semiconductor Field Effect Transistor) connected to the light emitting device;
   a switching unit including a switching MOSFET connected to the first scan line and the data line to perform a switching operation; and
   an optical sheet located on the light emitting device,
   wherein a parasitic capacitance between a gate and a drain of the switching MOSFET is smaller than a parasitic capacitance between a gate and a source of the driving MOSFET.

9. The planar lighting device of claim 8, wherein the individual unit compartment area corresponds to a unit of local dimming.

10. The planar lighting device of claim 8, wherein the at least one light emitting device disposed in the individual unit compartment area emits light of a single color.

11. The display device of claim 8, wherein the switching unit includes:
    a first switching MOSFET; and
    a second switching MOSFET connected in parallel with the first switching MOSFET with respect to the first scan line.

12. The display device of claim 11, wherein the first switching MOSFET and the second switching MOSFET are connected in a reverse direction.

13. The display device of claim 12, wherein the first switching MOSFET and the second switching MOSFET are connected such that source terminals thereof face each other.

14. The planar lighting device of claim 8, wherein the light emitting device is driven in the units of the multiple individual unit compartment areas.

15. The planar lighting device of claim 8, wherein at least one of the driving MOSFET or the switching MOSFET is mounted on a wiring layer formed on a substrate.

16. The planar lighting device of claim 8, wherein the second scan line is connected between the driver and the switching unit via a capacitor.

17. The planar lighting device of claim 16, wherein the capacitor is formed on a gate-off voltage line connected to the driver.

* * * * *